United States Patent [19]

Kobayashi et al.

[11] Patent Number: 5,045,763
[45] Date of Patent: Sep. 3, 1991

[54] MOTOR-CONTROL DEVICE FOR IMAGE FORMING APPARATUS

[75] Inventors: Masanari Kobayashi, Ichinomiya; Michitoshi Akao, Nagoya; Kenji Sakakibara, Ichinomiya; Takesi Izaki, Nagoya; Tokunori Katoh, Ichinomiya; Hiroshi Morisaki, Aichi, all of Japan

[73] Assignee: Brother Kogyo Kabushiki Kaisha, Nagoya, Japan

[21] Appl. No.: 470,311

[22] Filed: Jan. 25, 1990

[30] Foreign Application Priority Data

Jan. 28, 1989 [JP] Japan .................................. 1-19066
Jan. 30, 1989 [JP] Japan .................................. 1-20411

[51] Int. Cl.$^5$ .............................................. H04H 1/04
[52] U.S. Cl. ........................................ 318/270; 318/7; 355/235; 358/497
[58] Field of Search .................. 318/270, 618, 625, 7, 318/362; 355/208, 326, 235, 202, 309; 358/497, 483

[56] References Cited

U.S. PATENT DOCUMENTS 4,615,612 10/1986 Ohno et al. .................... 355/326
4,731,657 8/1988 Miyagi .......................... 318/270
4,780,767 10/1988 Ohta et al. ..................... 355/309
4,903,070 2/1990 Nakata et al. .................. 355/309

Primary Examiner—William M. Shoop, Jr.
Assistant Examiner—J. W. Cabela
Attorney, Agent, or Firm—Oliff & Berridge

[57] ABSTRACT

Motor-control device for an image forming apparatus includes a motor, an encoder, a microcomputer, and a driving circuit. The encoder generates a pulse signal in response to rotation of the motor. The microcomputer includes a CPU, a RAM and a ROM. The CPU detects actual rotational speed of the motor based upon the pulse signal generated by the encoder. The CPU cyclically provides a driving signal by comparing the actual rotational speed with a predetermined target rotational speed of the motor. An operating cycle is proportional to a cycle of the pulse signal generated by the encoder. The driving circuit drives the motor based upon the driving signal provided by the CPU. The CPU determines the operating cycle based upon the predetermined target rotational speed. The CPU also determines whether the motor condition is normal or abnormal by comparing the driving signal with a predetermined reference driving signal.

15 Claims, 5 Drawing Sheets

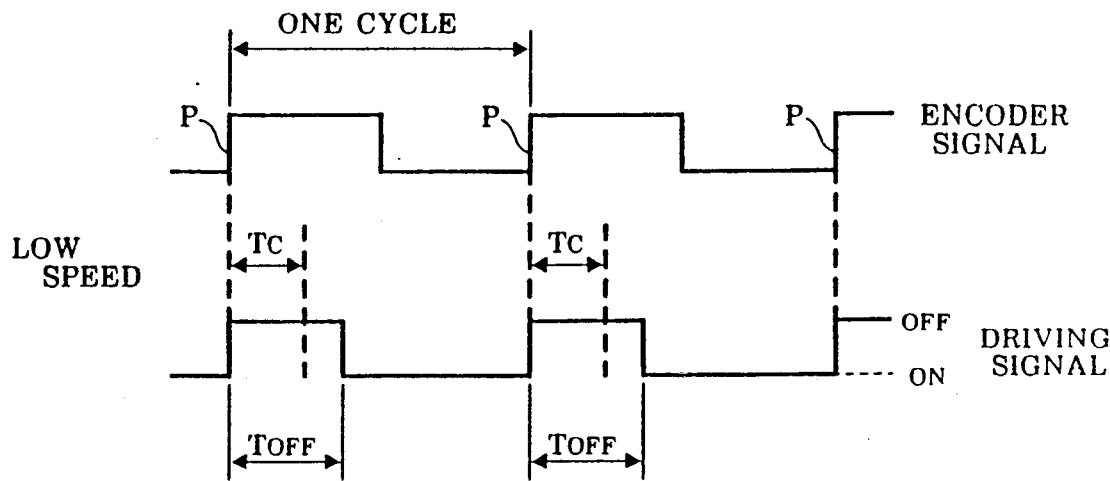
FIG. 5 (a) PRIOR ART
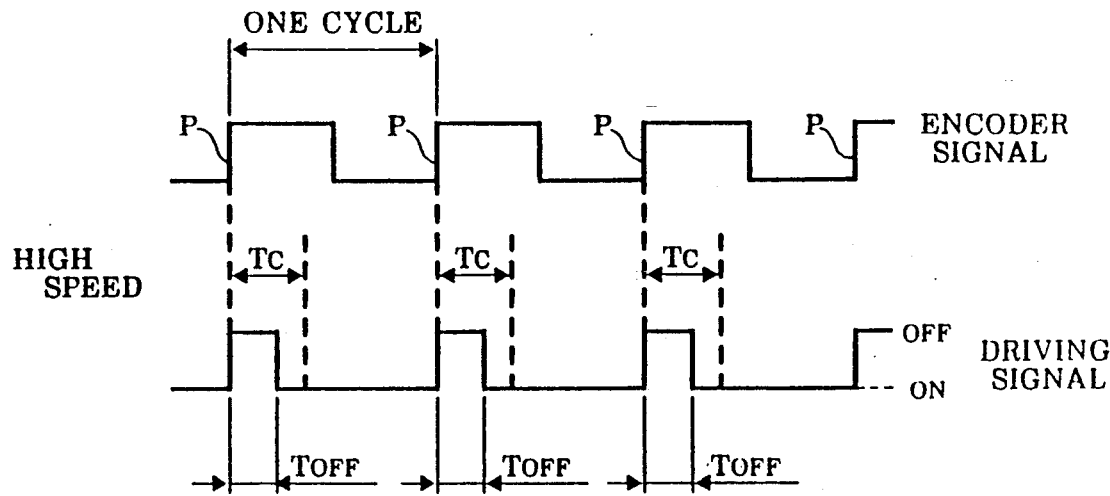
FIG. 5 (b) PRIOR ART

MOTOR-CONTROL DEVICE FOR IMAGE FORMING APPARATUS

BACKGROUND OF THE INVENTION

1. Field of the Invention

The present invention relates to a motor-control device for an image-forming apparatus, and more particularly to a control device for a variable speed motor.

2. Discussion of Related Art

A motor-control device has been used, for example, for driving a paper feeding roller of a copying machine. The conventional device includes a motor, an encoder for outputting a pulse signal in response to rotation of the motor, a microcomputer for receiving the pulse signal outputted from the encoder and for outputting a driving signal, and a motor driving circuit for receiving the driving signal outputted from the microcomputer and for driving the motor based on the driving signal. An interrupt signal is inputted to the microcomputer at a rising edge P in each cycle of the encoder signal as shown in FIG. 5(a). When the interrupt signal is inputted, the microcomputer stops supplying a driving signal to the driving circuit. The microcomputer controls the actual rotational speed of the motor based on the encoder signal by controlling the value of the driving signal to make the motor rotate at a target-rotational speed by comparing the actual rotational speed with the target-rotational speed. More specifically, the microcomputer controls the time $T_{OFF}$ in which the outputting of the driving signal is to be suspended in order to control the rotational speed. The microcomputer requires an operation time $T_C$ for the operation of the driving-signal-stop time $T_{OFF}$. After the operation is completed, when the driving-signal-stop time $T_{OFF}$ has passed from the rising edge P of the encoder signal, a driving signal is outputted to the motor-driving circuit.

In a conventional device, when it is intended to rotate a motor at a high speed, the time per cycle of the encoder signal is shortened with the increase of the motor speed. However, since the operation time $T_C$ of the computer is independent of the motor speed and is constant, if the driving-signal-stop time $T_{OFF}$ required becomes shorter than the operation time $T_C$ of the microcomputer as shown in FIG. 5(b), the time in which a driving signal can be outputted becomes shorter than the time in which the driving signal should be outputted. Because of this, there is a problem in a conventional device that the control of the rotational speed of the motor becomes impossible in a high speed operation of the motor.

SUMMARY OF THE PRESENT INVENTION

A principal object of the present invention is to provide a motor-control device for an image forming apparatus which is able to control a rotational speed of a motor in a high speed operation.

Another object of the present invention is to provide a motor-control device for an image forming apparatus, the device having a simple construction and being able to detect an overload exactly without using a hardware circuit such as an over-current protection circuit.

To achieve the principal object, a motor-control device for an image forming apparatus according to the present invention is arranged as shown to include the following: a motor; speed signal generating means for generating a speed signal relative to the rotational speed of the motor; operation means for cyclically providing a driving signal in response to the speed signal generated by the speed signal generating means; drive means for driving the motor in response to the driving signal provided by the operation means; and operating cycle determining means for determining an operating cycle of the operation means in response to the speed signal generated by the speed signal generating means.

To achieve another object of the present invention, a motor-control device for an image forming apparatus is arranged to include: a motor; speed detecting means for detecting the actual rotational speed of the motor; operation means for providing a driving signal by comparing the actual rotational speed with a predetermined target rotational speed of the motor; and judging means for judging whether the motor condition is normal or abnormal by comparing the driving signal with a predetermined reference driving signal.

BRIEF DESCRIPTION OF THE DRAWINGS

A preferred embodiment of the present invention will be described in detail with reference to the following figures wherein:

FIG. 5(a) is a timing chart showing an encoder signal and a motor driving signal in a low-speed operation of a conventional apparatus; and FIG. 5(b) is a timing chart showing an encoder signal and a motor driving signal in a high-speed operation of a conventional apparatus.

DETAILED DESCRIPTION OF THE PREFERRED EMBODIMENTS

Figure 2:
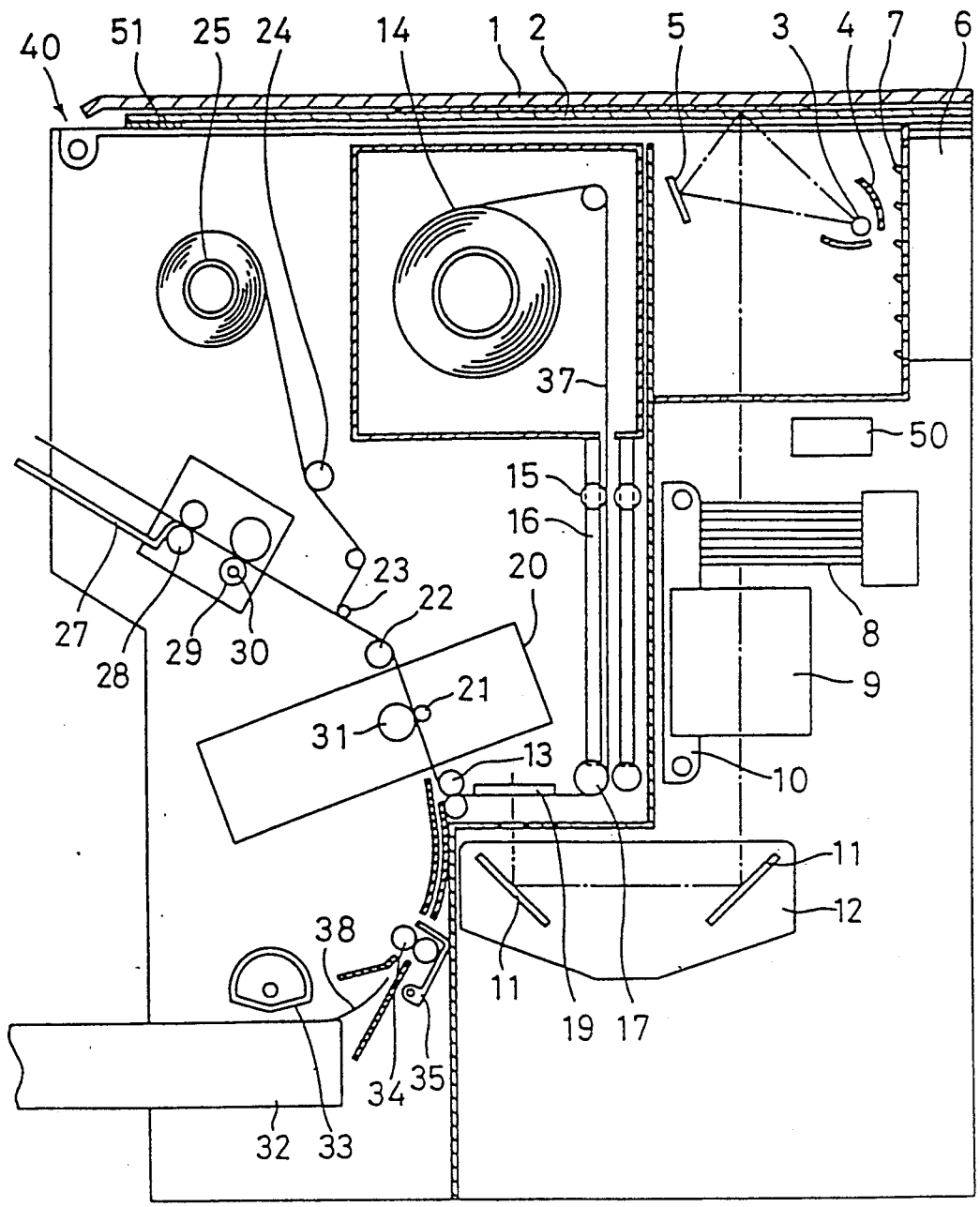
FIG. 2 is a cross sectional view of a copying machine to which the present invention is applied.

An embodiment will be described in which the present invention is employed in a motor-control device for a color copying machine. FIG. 2 shows a color copying machine 40 to which the present invention is applied. A manuscript-table glass 2 on which a manuscript is mounted, and a manuscript-table cover 1 for covering the manuscript-table glass 2, which cover 1 can be opened and closed, are provided to be movable to the right and left on the top plate of the color copying machine 40. A light source 3 which gives light to the manuscript is provided on the lower right side of the manuscript-table glass 2. The light source 3 is provided to extend in a direction orthogonal to the moving direction of the manuscript-table glass 2. During the radiation of light, the manuscript-table glass 2 is moved toward the right and left so that the surface of the manuscript is irradiated successively one part after another. A halogen lamp is used for the light source 3 and the halogen lamp 3 is surrounded with a reflection mirror 4 of a half cylindrical shape. A reflector 5 is provided on the left side of the halogen lamp 3 to efficiently utilize the light radiated from the halogen lamp 3 by reflecting the light which does not proceed directly to the manuscript toward the manuscript for utilization in irradiating the manuscript.

An exposure table 19 is provided at an approximately central area inside the copying machine 40. A filter 8 for the adjustment of color tone of a picture to be copied and a condenser lens 9 are supported by a fixing plate 10 between the exposure table 19 and the halogen lamp 3. Reflection mirrors 11 are provided between the lens 9 and the exposure table 19 and are adjustably supported by a fixing plate 12 for adjusting a focal point or a light path length. The filter 8 can be provided for adjusting the light quantity of each of the colors red, green and blue in the reflected light from the manuscript irradiated with the halogen lamp.

In the above construction, the light radiated from the halogen lamp 3 is reflected at the manuscript and the reflected light reaches the exposure table 19 through the light path which includes the filter 8, the lens 9 and the reflection mirrors 11. A color temperature sensor 50 which is provided between the halogen lamp 3 and the filter 8 detects the light quantity of each of the colors red, green and blue and outputs data for adjusting the insertion quantity of the filter 8 into the light path. Color temperature is corrected by this operation, and even if there is unevenness in the output of the halogen lamp 3, a copied picture without color misconvergence can be obtained. A white color reference panel 51 is fixed on the left end portion of the manuscript table glass 2, and reflects a reference reflection light necessary for the detection of the light by the color temperature sensor 50.

A cartridge 14 is housed to be freely mounted in or dismounted from an inside upper part of the main body of the copying machine 40. A take-up shaft 25 is rotatably held in the inside upper part of the main body 40. A long microcapsule paper 37 holding a plurality of microcapsules containing the dye etc. for color copying is stored in a wound state in the cartridge 14. After the microcapsule paper 37 is pulled out from the cartridge 14 by the rotation of a plurality of feed rollers 15 and 17, it is taken-up by the take-up shaft 25. During the above procedure, the portion which passes the undersurface of the exposure table 19 is exposed to form a latent image of the manuscript. A light shielding cover 16 is provided to prevent the microcapsule paper 37 pulled out from the cartridge 14 from being exposed. A feed roller 13 is provided to nip the microcapsule paper and to give a pull-out force for sending out the microcapsule paper 37.

In the main body of the copying machine 40, a cassette 32 is detachably mounted under the exposure table 19 to be loaded with development paper 38 as sheets having a fixed size. A pressure development device 20 is provided between the exposure table 19 and the take-up shaft 25. The exposed portion of the microcapsule paper 37 and the developing paper 38 are attached to each other with pressure in the pressure development device 20 to form a color image on the development paper 38 based on the latent image on the microcapsule paper 37. The development paper 38 is formed by applying a developer on a base material and by forming a surface resin layer of a heat soluble resin over the developer film. A sheet of paper with a small heat capacity or a sheet of PET (Polyethylene terephthalate), etc., with a large heat capacity is used as the base material. The development paper 38 is supplied from the cassette 32 to the pressure development device 20 by the rotation of a half-moon shaped roller 33. A feed roller 34 for transferring the development paper 38 toward the pressure development device 20 and a registering gate 35 for positioning the tip of the development paper 38 are provided between the cassette 32 and the pressure development device 20. An exfoliation roller 23 for exfoliating the development paper 38 from the microcapsule paper 37 is provided on the paper sending out side of the pressure development device 20. The pressure development device 20 comprises a small radius roller 21 and a backup roller 31. When the development paper 38 and the microcapsule paper 37 pass through the rollers 21 and 31 in a close contact state, these papers are pressed by the rollers, unexposed microcapsules are broken and an image is formed on the development paper 38. The backup roller 31 in the pressure development device 20 is designed so that it can be pressed against or released from the development paper 38 to provide a pulling-out force to the development paper 38 with its nips.

The microcapsule paper 37 and the development paper 38 taken out from the pressure development device 20 are conveyed with a feed roller 22 and are separated with the exfoliation roller 23; the microcapsule paper 37 is led to the upper side and the development paper 38 is led straight forward. The coloring of the development paper 38 is expedited by a heat-fixation device, and after that it is carried out to a paper discharge tray 27 keeping the picture image side facing upwardly. The heat-fixation device includes a hollow heat roller 29 having a heater 30 inside and a paper feed roller 28. The separated microcapsule paper 37 is wound on the take-up shaft 25 through a meandering-correction roller 24.

The color copying machine 40 having a construction as described above is provided with a first motor-control device and a second motor-control device. The first motor-control device is a device for driving the manuscript-table glass 2 and the feed rollers 13, 15 and 17. The second motor-control device is a device for driving the backup roller 31, the meandering-correction roller 24, the take-up shaft 25, the heat roller 29, and the feed roller 28. The members driven by the first and the second motor-control device change their driving speeds corresponding to the magnification or reduction of an image which can be set arbitrarily. Similar elements are used for the first and the second motor-control devices so that their operation is synchronized. Thus, to avoid repetition, only one motor-control device will be described.

Figure 1:
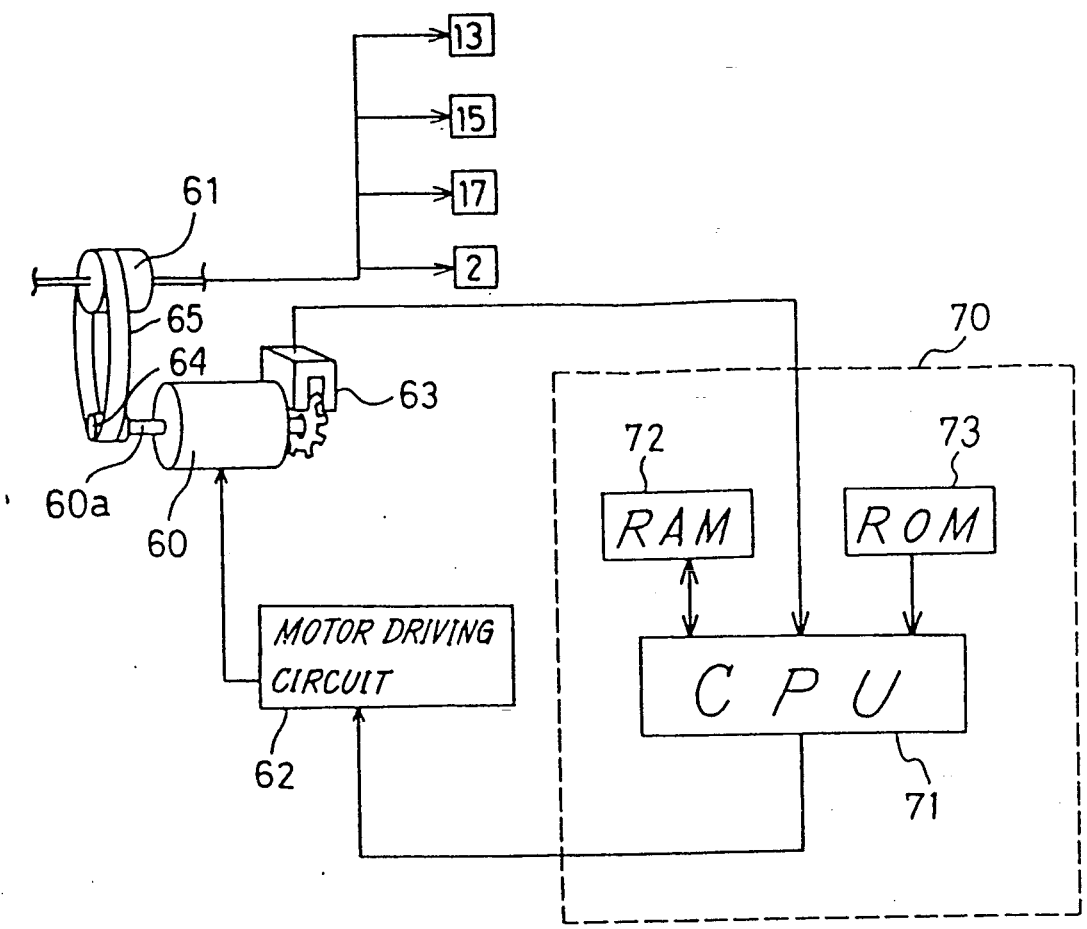
FIG. 1 is a general block diagram showing an embodiment of a motor-control device of the present invention.

The output shaft 60a of a DC motor 60 is connected to the manuscript-table glass 2 and to the feed rollers 13, 15 and 17 through a driving pulley 64, a belt 65 and a passive pulley 61, as shown in FIG. 1. The passive pulley 61 is operatively attached to mechanisms (not shown), such as, for example, another belt and a gear reduction mechanism, for moving glass 2 and feed rollers 13, 15 and 17. An encoder 63 which generates a pulse signal corresponding to the rotation of the output shaft 60a is fixed on the DC motor 60, and the encoder is connected to the central processing unit 71 (hereinafter referred to as CPU) of a microcomputer 70. The microcomputer 70 includes the CPU 71, a random access memory 72 (hereinafter referred to as RAM) for storing data temporarily, and a read only memory 73 (hereinafter referred to as ROM) in which the operation programs etc. for CPU 71, to be explained later, are stored. A motor driving circuit 62 is connected to the CPU 71, and the DC motor 60 is connected to the motor driving circuit 62. The CPU 71 supplies a driving signal to the driving circuit 62 based on the operation programs, and the driving circuit 62 applies a voltage to the coil of the DC motor 60 based on the driving signal.

Figure 3:
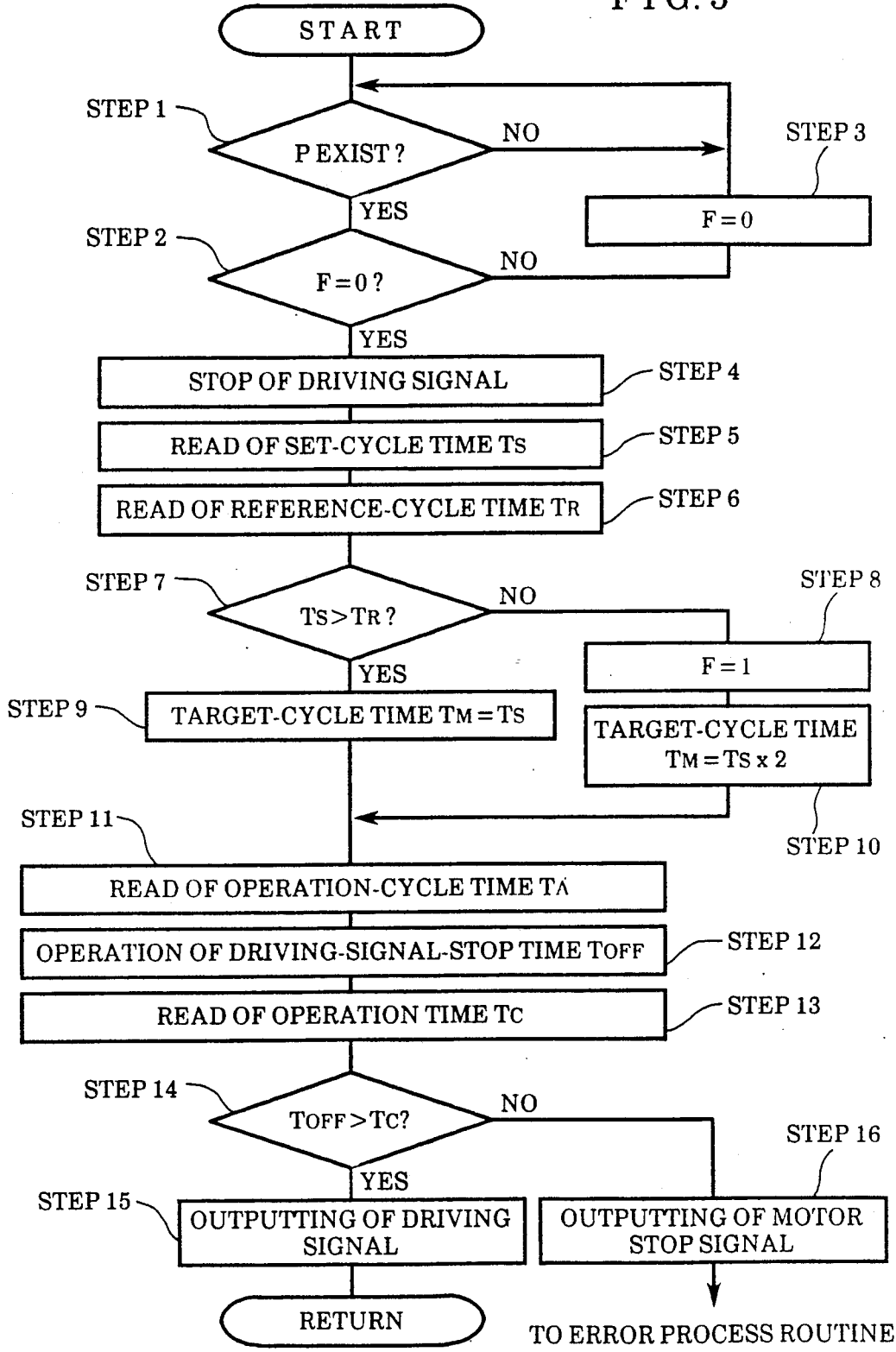
FIG. 3 is a flow chart showing the operation of a CPU.
Figure 4:
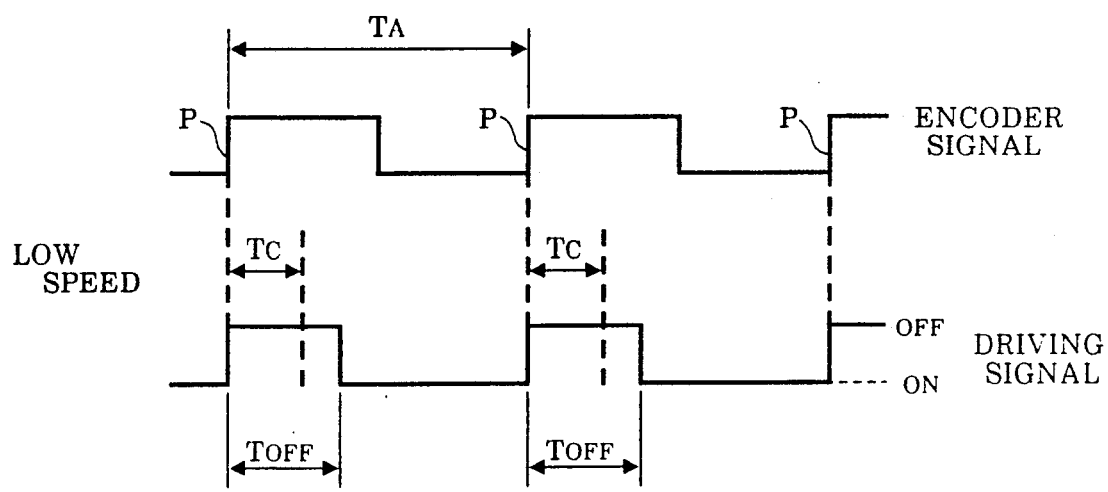
FIG. 4(a) is a timing chart showing an encoder signal and a motor driving signal in a low-speed operation.
FIG. 4(b) is a timing chart showing an encoder signal and a motor driving signal in a high-speed operation.
Figure 4:
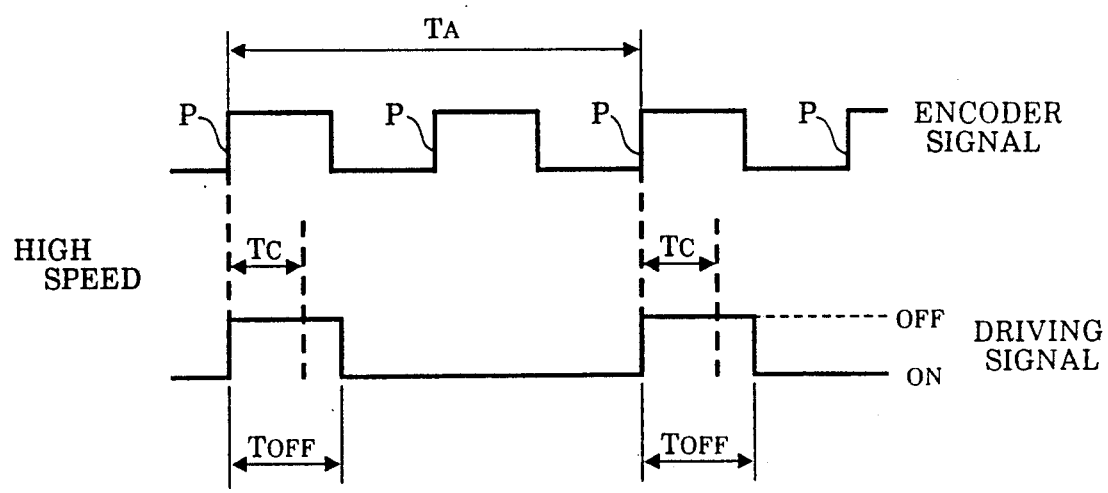

The operation of the first motor-control apparatus will be explained referring to FIG. 3 and FIG. 4. In step 1, the CPU 71 determines whether the rising edge P of an encoder signal is inputted from the encoder 63; if the signal is not inputted, it waits for the input of the signal, if the signal is inputted, it proceeds to step 2. In step 2, the CPU 71 reads the value of a flag F stored in the RAM 72, and judges whether or not the value of flag F is 0, if the value of the flag F is not 0, the CPU 71 changes the value of the flag F to 0 in step 3 and returns to step 1, and if the value of the flag F is 0, it proceeds to step 4. Therefore, when the value of the flag F is 1 in step 2 the CPU 71 has to wait for the rising edge P of the encoder signal in the next cycle to be inputted before proceeding to step 4. Even though a rising edge P of an encoder signal is inputted to the CPU, if the flag F is set to 1, the CPU will, in effect, skip the steps which would normally occur when a rising edge is detected. When the power supply for the color copying machine 40 is turned on, the value of the flag F is stored in the RAM 72 as 0.

In step 4, the CPU 71 stops outputting a driving signal to the motor driving circuit 62, and in step 5, the CPU reads the set-cycle time $T_S$ stored in the RAM 72. The set-cycle time $T_S$ is the target-cycle time of the encoder signal, it is read from a table in the ROM 73 and stored in the RAM 72 based on the set magnification (or reduction) of an image. The longer the set-cycle time $T_S$ is, the lower the target-rotational speed of the DC motor 60 becomes; the shorter the set-cycle time $T_S$ is, the higher the target-rotational speed of the DC motor becomes.

The CPU 71 reads the set-cycle time $T_S$, and next, in step 6, it reads a reference-cycle time $T_R$. The reference-cycle time $T_R$ is a reference value for determining whether the target-rotational speed of the DC motor 60 as determined by the set-cycle time $T_S$, described above, is a low speed or a high speed. In other words, when a driving-signal-stop time $T_{OFF}$ is initiated by the CPU 71 at every rising edge P in each cycle of the encoder signal, $T_R$ is a reference value which is used for determining whether the control of the DC motor 60 is possible or not. The reference-cycle time $T_R$ is determined beforehand and corresponds to the performance of the DC motor 60 and the encoder 63, and is stored in the ROM 73.

After the CPU 71 has read the set-cycle time $T_S$ and the reference-cycle time $T_R$, it determines whether the set-cycle time $T_S$ is longer than the reference-cycle time $T_R$ in step 7. When the set-cycle time $T_S$ is longer than the reference-cycle time $T_R$, the CPU 71 determines that the target-rotational speed of the DC motor 60 is a low speed and that therefore there will be enough energizing time after the operation of the driving-signal-stop time $T_{OFF}$ is used to stop the output of the driving signal to the motor driving circuit 62, to properly control the motor rotation speed. In this case, the control of the DC motor 60 is possible, and the procedure proceeds to step 9. In step 9, the CPU 71 writes the value of the set-cycle time $T_S$ to the RAM 72 as the target-cycle time $T_M$ and proceeds to step 11. In the step 7, when the set-cycle time $T_S$ is shorter than the reference-cycle time $T_R$, the CPU 71 determines that the target-rotational speed is a high speed and that there will not be enough energizing time after the operation of the driving-signal-stop time $T_{OFF}$ to stop the output of the driving signal to the motor driving circuit 62 to properly control the motor rotational speed. In this situation, the control of the DC motor 60 is impossible, and the procedure proceeds to step 8. In step 8, the CPU 71 changes the value of the flag F from 0 to 1. When the value of the flag F is changed to 1 in step 8, even if the rising edge P of the encoder signal in the next cycle is inputted to the CPU 71, it neglects the input as described above in step 2; thereby, securing additional energizing time, which makes it possible to control the DC motor 60. After changing the value of Flag F to 1, the CPU 71 writes twice the value of the set-cycle time $T_S$ to the RAM 72 as the target-cycle time $T_M$ in step 10, and proceeds to step 11. By this operation, setting the value of Flag F to 1 in step 8 prevents the procedure from stopping the driving signal upon the next rising edge P due to step 2. This essentially doubles the cycle time over which time $T_{OFF}$ can be used to control the motor-rotational speed. However, since the cycle time now corresponds to two cycle times of the encoder signal, the time $T_{OFF}$ must be doubled. The doubling of the time $T_{OFF}$ is achieved by step 10 and thereby causes the time $T_{OFF}$ to once again be longer than the operation time $T_C$ of the microcomputer. In this case, the driving signal provided by the CPU 71 to the motor driving circuit 62 controls the motor rotational speed over two encoder signal cycles.

In step 11, the CPU 71 reads an operation-cycle time $T_A$ based on the encoder signal. The operation-cycle time $T_A$ is a one-cycle time of the encoder signal when the target-rotational speed is low, as shown in FIG. 4(a), and the operation-cycle time $T_A$ is a two-cycle time of the encoder signal when the target-rotational speed is high as shown in FIG. 4(b).

After reading the operation-cycle time $T_A$, the CPU 71 reads the target-cycle time $T_M$ from the RAM 72 in step 12. The CPU 71 compares the operation-cycle time $T_A$, a function of an actual rotational speed of the motor 60, with the target-cycle time $T_M$, a function of the target-rotational speed of the DC motor 60 and controls the duration of the driving-signal-stop time $T_{OFF}$, and proceeds to step 13. In step 13, the CPU 71 reads an operation time $T_C$ from the ROM 73. Since the operation time $T_C$ is always constant, it is stored in the ROM 73 beforehand.

In step 14, the CPU 71 determines whether the driving-signal-stop time $T_{OFF}$ is longer than the operation time $T_C$. When the driving-signal-stop time $T_{OFF}$ is longer than the operation time $T_C$, it proceeds to step 15. In step 15, the CPU 71 outputs the driving signal to the motor driving circuit 62 when the driving-signal-stop time $T_{OFF}$ elapses from the rising edge P of the encoder signal. In step 14, when the driving-signal-stop time $T_{OFF}$ is shorter than the operation time $TC_C$, the CPU 71 judges that the DC motor 60 is in trouble or the DC motor 60 is loaded with an abnormal load such as paper jamming and proceeds to step 16. In step 16, the CPU 71 stops the DC motor 60 by outputting a motor-stop signal to the motor-driving circuit 62 and shifts over to an error-process routine.

As described in detail above, according to the present invention, a motor-control device for a color copying machine can be realized wherein control in a high-speed operation is possible, and the motor can be stopped by detecting an abnormality such as a trouble or an overload of the motor without providing any hardware circuitry for that exclusive use.

What is claimed is:

1. A motor control device for an image forming apparatus comprising:
a motor;
speed signal generating means for generating a speed signal relative to the rotation speed of the motor;
operation means for cyclically providing a driving signal based upon the speed signal generated by the speed signal generating means;
drive means for driving the motor based upon the driving signal provided by the operation means; and
operating cycle determining means for determining an operating cycle of the operation means based upon the speed signal generated by the speed signal generating means, said operation cycle determining means determining the operating cycle to correspond to more than one complete cycle of the motor when the predetermined target speed signal is above a reference speed signal and determining the operating cycle to correspond to one complete cycle of the motor when the predetermined target speed signal is less than said reference speed signal.

2. The motor control device according to claim 1, further comprising:
at least one feed roller for feeding paper; and
connection means for connecting the at least one feed roller with the motor.

3. A motor control device according to claim 1, wherein said operating cycle determining means determines the operating cycle by comparing the speed signal generated by the speed signal generating means with a predetermined target speed signal.

4. A motor control device according to claim 1, wherein the driving signal includes an ON-time and an OFF-time.

5. A motor control device according to claim 4, further comprising:
motor stop means for stopping the supply of the driving signal to the drive means if the OFF-time is less than a predetermined reference operation time.

6. A motor control device for an image forming apparatus comprising:
a motor;
an encoder for generating a pulse signal in response to rotation of the motor;
speed detecting means for detecting actual rotational speed of the motor based upon the pulse signal generated by the encoder;
operation means for cyclically providing a driving signal by comparing the actual rotational speed with a predetermined target rotational speed of the motor, an operating cycle of the operation means being proportional to a cycle of the pulse signal generated by the encoder;
a drive circuit for driving the motor based upon the drive signal provided by the operating means; and
operating cycle determining means for determining the operating cycle of the operation means based upon the predetermined target rotational speed, said operating cycle determining means determining said operating cycle to be equal to a single cycle of the pulse signal when the predetermined target rotational speed of the motor is less than a predetermined reference speed and to be equal to more than one cycle of the pulse signal when the predetermined target rotational speed of the motor is greater than said predetermined reference speed.

7. The motor control device according to claim 6, further comprising:
at least one feed roller for feeding paper; and
connection means for connecting the feed roller with the motor.

8. A motor control device according to claim 6, wherein the driving signal includes an ON-time and an OFF-time.

9. A motor control device according to claim 8, further comprising:
motor stop means for stopping supply of the driving signal to the drive means if the OFF-time is less than a predetermined reference operation time.

10. A motor control device for image forming apparatus comprising:
a motor;
speed detecting means for detecting actual rotational speed of the motor;
operation means for providing a driving signal by comparing the actual rotational speed with a predetermined target rotational speed of the motor, wherein said driving signal and said reference driving signal each have ON-times and OFF-times;
determining means for determining the motor condition to be abnormal if the driving signal OFF-time is less than the reference driving signal OFF-time;
drive means for driving the motor based upon the driving signal provided by the operation means; and
motor stop means for stopping supply of the driving signal to the drive means when the determining means determines that the motor condition is abnormal.

11. The motor control device according to claim 10, further comprising:
a feed roller for feeding paper; and
connection means for connecting the feed roller with the motor.

12. The motor control device according to claim 10, wherein said driving signal provided by said operation means is cyclical, said motor control device further comprising operating cycle determining means for determining an operating cycle of the operation means based upon said actual rotational speed of the motor.

13. A motor control device for an image forming apparatus comprising:
a motor;
an encoder for generating a pulse signal in response to rotation of the motor;
speed detecting means for detecting actual rotational speed of the motor based upon the pulse signal generated by the encoder;
operation means for cyclically providing a driving signal by comparing the actual rotational speed with a predetermined target rotational speed of the motor, an operating cycle being proportional to a cycle of the pulse signal generated by the encoder;
a driving circuit for driving the motor based upon the driving signal provided by the operation means;
operating cycle determining means for determining the operating cycle of the operation means based upon the predetermined target rotational speed, said operating cycle determining means determining said operating cycle to be equal to a single cycle of the pulse signal when the predetermined target rotational speed of the motor is less than a predetermined reference speed signal and determining said operating cycle to be equal to more than one cycle of the pulse signal when the predetermined target rotational speed is greater than said predetermined reference speed signal;

determining means for determining whether the motor condition is abnormal and that the motor should be stopped by comparing the driving signal with a predetermined reference driving signal; and motor stop means for stopping supply of the driving signal to the driving circuit when the determining means determines that the motor condition is abnormal.

14. The motor control device according to claim 13, further comprising:
a feed roller for feeding paper; and
connection means for connecting the feed roller with the motor.

15. A motor control device according to claim 13, wherein said driving signal and said reference driving signal each have an ON-time and an OFF-time and wherein said determining means determines the motor condition to be abnormal if the driving signal OFF-time is less than the reference signal OFF-time.

* * * * *